United States Patent
Inaki et al.

(10) Patent No.: US 7,645,526 B2
(45) Date of Patent: Jan. 12, 2010

(54) MEMBER FOR PLASMA ETCHING DEVICE AND METHOD FOR MANUFACTURE THEREOF

(75) Inventors: Kyoichi Inaki, Tokyo (JP); Itsuo Araki, Kumamoto (JP)

(73) Assignee: Shin-Etsu Quartz Products, Ltd., Tokyo (JP)

( * ) Notice: Subject to any disclaimer, the term of this patent is extended or adjusted under 35 U.S.C. 154(b) by 59 days.

(21) Appl. No.: 10/546,798

(22) PCT Filed: Sep. 16, 2003

(86) PCT No.: PCT/JP03/11768

§ 371 (c)(1),
(2), (4) Date: Aug. 23, 2005

(87) PCT Pub. No.: WO2005/029564

PCT Pub. Date: Mar. 31, 2005

(65) Prior Publication Data

US 2006/0172544 A1    Aug. 3, 2006

(51) Int. Cl.
| | |
|---|---|
| *B32B 9/00* | (2006.01) |
| *B32B 19/00* | (2006.01) |
| *C03C 3/04* | (2006.01) |
| *C03C 3/06* | (2006.01) |
| *C04B 35/50* | (2006.01) |

(52) U.S. Cl. .................. 428/701; 428/689; 428/699

(58) Field of Classification Search ............... 428/304.4, 428/332, 336, 697, 699; 501/53, 54, 64, 501/152, 153
See application file for complete search history.

(56) References Cited

U.S. PATENT DOCUMENTS

| | | | |
|---|---|---|---|
| 5,139,856 A | * 8/1992 | Takeuchi et al. ............ 428/216 |
| 5,798,016 A | * 8/1998 | Oehrlein et al. ......... 156/345.37 |
| 6,447,937 B1 | * 9/2002 | Murakawa et al. .......... 428/696 |
| 2002/0012791 A1 | * 1/2002 | Morita et al. ............... 428/336 |
| 2002/0086554 A1 | 4/2002 | O'Donnell |
| 2002/0076559 A1 | * 6/2002 | Sato et al. .................... 428/426 |
| 2002/0177001 A1 | 11/2002 | Harada et al. |
| 2003/0051811 A1 | * 3/2003 | Uchimaru et al. ......... 156/345.1 |
| 2004/0137147 A1 | 7/2004 | O'Donnell et al. |

FOREIGN PATENT DOCUMENTS

| | | |
|---|---|---|
| EP | 1 156 130 | 11/2001 |
| JP | 2001-118910 | 4/2001 |
| JP | 2002-68864 | 3/2002 |
| JP | 2002-265231 | * 9/2002 |
| JP | 2002-308683 | 10/2002 |
| JP | 2003-59904 | 2/2003 |
| JP | 2003-297809 | 10/2003 |
| JP | 3613472 | 10/2004 |
| WO | WO-02/052628 | 7/2002 |

* cited by examiner

*Primary Examiner*—Timothy M Speer
*Assistant Examiner*—Jonathan C Langman
(74) *Attorney, Agent, or Firm*—Jordan and Hamburg LLP

(57) ABSTRACT

A member for a plasma etching device, comprising a coating film of yttrium oxide or YAG having a coating film thickness of 10 μm or more, a coating film thickness variance of 15% or less, preferably a surface roughness (Ra) of 1 μm or less, formed on a surface of a member, comprising quartz glass which contains 1 to 10% by weight of yttrium oxide or YAG. The member for a plasma etching device has high plasma resistance, is not subjected to an abnormal etching on the basis of a partial change of electric properties and, accordingly, can be used for a long period of time. Even when the member is large enough to handle 12-inch Si wafers, the above-described advantageous properties are maintained and the member can be used for a long period of time.

3 Claims, No Drawings

MEMBER FOR PLASMA ETCHING DEVICE AND METHOD FOR MANUFACTURE THEREOF

TECHNICAL FIELD

The present invention relates to a member for use in a plasma etching apparatus for a semiconductor device and, particularly, to a member for a plasma etching apparatus coated with a coating film of yttrium oxide or YAG.

BACKGROUND ART

Heretofore, in a production process of a semiconductor device, an etching treatment has been performed on a thin film on an Si wafer by making use of an ion or a radical generated in a plasma. As for such plasma etching treatment method, there is, for example, a method in which a thin film on a surface of an Si wafer is etched by a chemical etching mechanism or a physical etching mechanism, or a method in which the thin film is anisotropically etched by electrically accelerating a speed of an ion and, then, drawing it to the surface of the Si wafer. At the time of performing the plasma etching treatment, a member or a container (hereinafter referred to also as "member") containing quartz glass, aluminum, alumite or the like has ordinarily been used. On this occasion, there is a problem in that a surface of the member itself is also etched and, then, a particle is generated, to thereby contaminate a semiconductor device. For this account, a method in which a tape containing a fluorocarbon resin or an engineering plastic is applied on a surface of the member for the sake of convenience or a method in which a coating film containing the above-described resin is formed has been proposed. However, in the method for applying the tape, since a film thickness of the tape itself is small, etching resistance is not sufficient and also, since a joint portion is formed by applying the tape, a plasma ion is penetrated into a gap formed on this portion and, then, a substrate is partially etched or, since it is difficult to uniformly apply the tape on the surface, a gap is partially generated between the substrate and the tape and, due to the gap, an irregularity is generated on the surface and, then, an irregularity of electric properties is generated on the surface and, due to this irregularity, an insulation failure is partially generated, to thereby cause such a problem as generating a pinhole in the tape. Further, there is a drawback in that a contaminant is released from an adhesive of the tape and, then, properties of the Si wafer are deteriorated.

Further, as for the member which has been coated with the conventional fluorocarbon resin or engineering plastic, since a surface thereof tends to be roughened, the plasma is not well generated and there is also a drawback in that a pinhole is generated in the film or the like.

In order to solve these drawbacks of members containing quartz glass, aluminum, alumina or the like, a member containing ceramics which are excellent in plasma resistance is proposed in JP-A-2001-118910 or the like. However, there is a problem in that a crack or a bent is generated in the member containing the above-described ceramics at the time of calcining and, then, preparation of a large-sized member is not only difficult but also expensive.

Thus, a first object of the present invention is to provide a member for a plasma etching apparatus which has a high plasma resistance, does not perform any abnormal etching to be caused by a partial change of electrical properties and can be used for a long period of time.

Further, a second object of the present invention is to provide a member for a plasma etching apparatus which can handle such a large-sized semiconductor device as being a 12-inch Si wafer.

Still further, a third object of the present invention is to provide a method for producing the above-described member for the plasma etching apparatus.

DISCLOSURE OF THE INVENTION

The present invention relates to a member for a plasma etching apparatus in which a coating film of yttrium oxide or yttrium aluminum garnet (hereinafter, referred to also as "YAG") having a thickness of 10 μm or more, a film thickness variance of 10% or less and, preferably, a surface roughness Ra of 1 μm or less is formed on a surface of a member containing quartz glass, and also relates to a method for producing a member for a plasma etching apparatus in which a coating film of yttrium oxide or YAG is formed on a surface of a member for a plasma etching apparatus containing quartz glass, aluminum, alumite or a combination thereof by any one of a method of plasma-spraying yttrium oxide or YAG, a method of fusing yttrium oxide or YAG powder by an oxyhydrogen flame and, then, performing coating by using the thus-fused article, a method of applying a solution in which yttrium, a yttrium compound or YAG is dissolved and, then, performing heat-fusing and a combination of these methods.

BEST MODE FOR CARRYING OUT THE INVENTION

Hereinafter, the present invention is described in detail.

A member for a plasma etching apparatus according to the invention contains quartz glass, and has on a surface thereof a coating film of yttrium oxide or YAG having a film thickness of 10 μm or more, a film thickness variance of 10% or less and, preferably, further, a surface roughness Ra of 1 μm or less. When the film thickness of the above-described coating film of yttrium oxide or YAG is less than 10 μm, a pinhole tends to be generated and thickness of a ridge portion becomes extremely small, to thereby generate a crack. Further, when the surface roughness Ra is over 1 μm, electric properties on a surface of the coating film are partially changed, to thereby generate an abnormal etching. Further, when the film thickness variance is more than 10%, although the surface roughness Ra of the coating film is 1 μm or less, a large undulation is generated and, then, due to this large undulation, electrical properties of the coating film are deteriorated, to thereby easily generate a pinhole by plasma. Preferably, the ridge portion of the member is subjected to rounding machining so as to have a size of R 0.5 mm or more and, then, yttrium oxide of YAG is applied as a coating film. By this rounding machining, the thickness of the coating film is prevented from becoming small, to thereby suppress generation of pinholes. As for the rounding machining in a case of a member containing quartz glass, a method of machining the ridge portion by an oxyhydrogen flame, a method of mechanically polishing the ridge portion by a grinder or the like or a method of blowing crystalline silicon dioxide powder, silicone carbide powder or the like on the ridge portion can be adopted.

A member in which a member is previously formed by using quartz glass containing yttrium oxide or YAG in the range of from 1 to 10% by weight and, then, on the thus-formed member, the coating film of yttrium oxide or YAG is formed. By performing such arrangement as described above, difference of coefficient of thermal expansion between the member and the coating film of yttrium oxide or YAG becomes smaller, to thereby decrease film separation, enhance plasma resistance, suppress generation of the particle and expand a service life.

Next, an aspect of the method for producing the member for the plasma etching apparatus according to the present invention is described. Namely, there is a production method in which a starting material containing quartz glass, is machined to form a member for a plasma etching apparatus and, then, on the thus-formed surface of the member, a coating film of yttrium oxide or YAG is formed by any one of (i) a method of plasma-spraying yttrium oxide or YAG, (ii) a method of fusing yttrium oxide or YAG powder in an oxyhydrogen flame and, then, performing coating with the thus-fused article, (iii) a method of applying a solution in which yttrium, a yttrium compound or YAG is dissolved on a member, drying the thus-applied solution and, then, heat-fusing the thus-dried article by the oxyhydrogen flame (hereinafter, referred to also as "solution application method"), and a combination of these methods. After a coating film of yttrium oxide or YAG is formed by the solution application method among these methods, when yttrium oxide or YAG is plasma-sprayed on the thus-formed coating film, a film thickness comes to be large and, further, a homogeneous yttrium oxide or YAG coating film is formed, which is preferred. It is preferable that a film thickness of the coating film of yttrium oxide or YAG is 10 μm or more, a coating film variance is 10% or less and, preferably, further, a surface roughness Ra is 1 μm or less. As for yttrium compounds to be used by the solution application method, a hydroxide, a nitrate, a carbonate, a sulfate, an oxalate thereof and the like are mentioned. As for solvents for use in dissolving the yttrium, yttrium compounds or YAG, pure water, an organic solvent is mentioned. A coating solution is prepared by dissolving yttrium, the yttrium compound or YAG. In the solution application method, in order to prevent the generation of the pinhole, the solution is preferably applied 3 times or more.

A surface of the member is preferably subjected to a roughening treatment prior to coating with yttrium oxide or YAG. By such treatment, the coating film becomes difficult to be slipped and, then, film separation can be prevented. The term "frost treatment" as used herein means to provide irregularity on a surface of quartz glass by a physical measure or a chemical measure. As for such physical measures, there are a so-called sandblast method in which crystalline silicon dioxide powder, silicon carbide powder or the like is blown by compressed air, a method in which crystalline silicon dioxide powder, silicon carbide powder or the like is provided on a brush and, then, the surface thereof is polished by using the resultant brush while being wet with water and the like. Further, as for such chemical measures, there are a chemical solution treatment method in which the member is dipped in a mixed reagent of hydrogen fluoride and ammonium fluoride and the like. Particularly, in the chemical measure, since a micro-crack is not generated on the surface and mechanical strength of quartz glass on the surface is not deteriorated, the chemical measure is preferred. The surface roughness Ra to be formed by the frost treatment is preferably in the range of from 0.1 to 10 μm. In a case in which the surface roughness Ra is beyond this range, adhesiveness between the coating film of yttrium oxide or YAG and quartz glass is not sufficiently improved; accordingly, the case is not preferred.

Hereinafter, the present invention is specifically described with reference to embodiments but is not limited thereto.

COMPARATIVE EXAMPLE 1

A quartz glass chamber for a dry etching apparatus for a 12-inch Si wafer was prepared. A ridge portion of the chamber was subjected to rounding machining so as to have a size of R 2 mm by blowing crystalline silicon dioxide powder on an inner surface of the thus-prepared quartz glass chamber. Further, by blowing crystalline silicon dioxide powder (grain diameter: 100 to 300 μm) also on an entire inner surface of the chamber, the inner surface was allowed to be an irregular face having a surface roughness Ra of 2.5 μm and a Rmax of 20 μm. On the thus-formed inner surface of the quartz glass chamber, $Y_2O_3$ was plasma-sprayed, to thereby form a $Y_2O_3$ coating film having a thickness of 40 μm. A surface roughness Ra of the coating film was 0.2 μm and a film thickness variance thereof was 12%.

Inside the above-described quartz glass chamber, a gas mixture of $CF_4+O_2$ was allowed to be in a plasmatic condition and, then, an oxide film of the 12-inch Si wafer was etched. Although this chamber was used for 5 weeks, there was no incidence in which the $Y_2O_3$ coating film was etched to expose the quartz glass and there was no generation of an abnormal particle on a surface of the Si wafer.

COMPARATIVE EXAMPLE 2

A quartz glass chamber of 12 inch was prepared by using quartz glass in a same manner as in Reference Example 1. A ridge portion of this chamber was subjected to rounding machining by being heated by an oxyhydrogen flame so as to have a size of R 1 mm. Further, the quartz glass chamber was subjected to an etching treatment by using a chemical solution of hydrofluoric acid and ammonium fluoride, to thereby form an irregular face having an Ra of 1.5 μm and a Rmax of 13 μm on an inner surface thereof. On the thus-formed inner surface of the chamber, YAG was plasma-sprayed, to thereby form a YAG coating film of 50 μm. A surface roughness Ra of the YAG coating film on this occasion was 0.5 μm and a film thickness variance thereof was 8%.

Inside the above-described quartz glass chamber, a gas mixture of $CF_4+O_2$ was allowed to be in a plasmatic condition and, then, an oxide film of the 12-inch wafer was etched. Although this chamber was used for 5 weeks, there was no incidence in which the YAG coating film was etched to expose the quartz glass and there was no generation of an abnormal particle on a surface of the Si wafer.

COMPARATIVE EXAMPLE 3

An aluminum cover for a dry etching apparatus for a 12-inch Si wafer was prepared. A surface of the aluminum cover was subjected to an alumite treatment. A ridge portion of the aluminum cover was subjected to rounding machining so as to have a size of R 1 mm and, then, an outer surface thereof was plasma-sprayed with $Y_2O_3$, to thereby form a $Y_2O_3$ coating film of 200 μm. A surface roughness Ra of the $Y_2O_3$ coating film on this occasion was 0.1 μm and a film thickness variance thereof was 15%.

Inside the etching apparatus provided with the aluminum cover, a gas mixture of $CF_4+O_2$ was allowed to be in a plasmatic condition and, then, an oxide film of the 12-inch wafer was etched. Although this cover was used for 5 weeks, there was no incidence in which the $Y_2O_3$ coating film was etched to expose aluminum and there was no generation of an abnormal particle on a surface of the Si wafer.

COMPARATIVE EXAMPLE 4

Quartz powder was blended with 5% by weight of $Y_2O_3$ powder and, then, sufficiently homogeneously mixed by a ball mill. The resultant starting material was fused in an oxyhydrogen flame, to thereby prepare an ingot of quartz glass. From the ingot which is a base material, a quartz glass chamber for a dry etching apparatus of 12-inch Si wafer was prepared. Crystalline silicon dioxide powder (100 to 300 μm) was blown on an inner surface of this chamber, to thereby form an irregular face having a surface roughness Ra of 2.5 μm and an Rmax of 20 μm. Then, $Y_2O_3$ was plasma-sprayed on the thus-formed inner face of the chamber, to thereby obtain a $Y_2O_3$ coating film having a thickness of 150 μm. A surface roughness Ra of the coating film was 0.5 μm and a film thickness variance thereof was 10%.

Inside the above-described quartz glass chamber, a gas mixture of $CF_4+O_2$ was allowed to be in a plasmatic condition and, then, an oxide film of the 12-inch Si wafer was etched. Although this chamber was used for 12 weeks, there was no incidence in which the $Y_2O_3$ coating film was etched to expose the quartz glass and there was no generation of an abnormal particle on a surface of the Si wafer.

COMPARATIVE EXAMPLE 5

A quartz glass chamber for a dry etching apparatus for a 12-inch Si wafer was prepared. A ridge portion of this chamber was subjected to rounding machining by being heated by an oxyhydrogen flame so as to have a size of R 1 mm. Further, an inside of the chamber was subjected to an etching treatment by using a chemical solution of hydrofluoric acid and ammonium fluoride, to thereby form an irregular face having a surface roughness Ra of 2.5 μm and a Rmax of 20 μm. On the thus-formed inner surface of the chamber, an yttrium nitrate solution was applied 4 times, dried and, then, heat-fused by the oxyhydrogen flame, to thereby obtain a $Y_2O_3$ coating film of 50 μm. A surface roughness Ra of the coating film was 0.5 μm and a film thickness variance thereof was 8%.

Inside the above-described quartz glass chamber, a gas mixture of $CF_4+O_2$ was allowed to be in a plasmatic condition and, then, an oxide film of the 12-inch Si wafer was etched. Although this chamber was used for 12 weeks, there was no incidence in which the $Y_2O_3$ coating film was etched to expose the quartz glass and there was no generation of an abnormal particle on a surface of the Si wafer.

COMPARATIVE EXAMPLE 1

A quartz glass chamber for a dry etching apparatus for a 12-inch Si wafer was prepared. Inside this quartz glass chamber, a gas mixture of $CF_4+O_2$ was allowed to be in a plasmatic condition and, then, an oxide film of the 12-inch Si wafer was etched. When this chamber was used for 2 weeks, an abnormal particle was generated on a surface of the Si wafer and, accordingly, the chamber was stopped using for more than one week.

COMPARATIVE EXAMPLE 2

An aluminum cover for a dry etching apparatus for a 12-inch Si wafer was prepared. A surface thereof was subjected to an alumite treatment. A polyimide tape of 125 μm was attached to an outer surface of the thus-treated aluminum cover. In an etching apparatus provided with this aluminum cover, a gas mixture of $CF_4+O_2$ was allowed to be in a plasmatic condition and, then, an oxide film of an 8-inch wafer was etched. When this cover was used for 2 weeks, a gap of the polyimide tape was abnormally etched to expose aluminum and, then, irregularity was generated on the surface thereof, to thereby partially accelerate etching and generate a pinhole on the polyimide tape. 2 weeks later, the polyimide tape was removed and a new polyimide tape was attached again. When the resultant aluminum cover was set on the apparatus, an abnormal contamination was noticed on the wafer and, then, the apparatus was stopped using.

COMPARATIVE EXAMPLE 3

An aluminum cover for a dry etching apparatus for a 12-inch Si wafer was prepared. A surface thereof was subjected to an alumite treatment. In an etching apparatus provided with this aluminum cover, a gas mixture of $CF_4+O_2$ was allowed to be in a plasmatic condition and, then, an oxide film of the 12-inch Si wafer was etched. When this cover was used for 2 weeks, the alumite was removed 1 week after the start of the usage and generation of a particle was noticed on a surface of the wafer and, then, the apparatus was stopped using.

INDUSTRIAL APPLICABILITY

The member for the plasma etching apparatus according to the present invention has a high plasma resistance and, further, is not subjected to an abnormal etching on the basis of a partial change of electric properties and, accordingly, can be used for a long period of time. Particularly, even when the member is large enough to handle a 12-inch Si, the above-described properties are maintained and, then, it can be used for long period of time.

The invention claimed is:

1. A member for a plasma etching apparatus, consisting of a coating film of yttrium oxide having a film thickness of 10 μm or more and a thickness variance of 15% or less formed on a frost-treated surface of the member, said member comprising quartz glass and 1 to 10% by weight of yttrium oxide.

2. A member for a plasma etching apparatus, consisting of a coating film of YAG having a film thickness of 10 μm or more and a thickness variance of 15% or less formed on a frost-treated surface of the member, said member comprising quartz glass and 1 to 10% by weight of YAG.

3. The member for the plasma etching apparatus according to either of claims 1 or 2, wherein the surface roughness Ra of the coating film is 1 μm or less.

* * * * *